United States Patent [19]

Wu et al.

[11] Patent Number: 5,721,656
[45] Date of Patent: Feb. 24, 1998

[54] ELECTROSTATC DISCHARGE PROTECTION NETWORK

[75] Inventors: Chau-Neng Wu, Kaohsiung Hsien; Ming-Dou Ker, Tainan Hsien, both of Taiwan

[73] Assignee: Winbond Electronics Corporation, Taiwan, Taiwan

[21] Appl. No.: 661,105

[22] Filed: Jun. 10, 1996

[51] Int. Cl.$^6$ ................................ H02H 3/22
[52] U.S. Cl. ..................... 361/56; 361/111; 257/355
[58] Field of Search ................. 361/56, 111, 91; 256/355-363

[56] References Cited

U.S. PATENT DOCUMENTS

| | | | |
|---|---|---|---|
| 5,086,365 | 2/1992 | Lien | 361/58 |
| 5,208,719 | 5/1993 | Wei | 361/56 |
| 5,515,226 | 5/1996 | Tailliet | 361/56 |
| 5,521,783 | 5/1996 | Wolfe et al. | 361/56 |
| 5,541,801 | 7/1996 | Lee et al. | 361/56 |
| 5,631,793 | 5/1997 | Ker et al. | 361/56 |

OTHER PUBLICATIONS

K. Narita et al., A Novel On–Chip Electrostatic Discharge (ESD) Protection For Beyound 500MHz DRAM; IEDM Proceeding, 1995; pp. 539–542.

Primary Examiner—Brian K. Young
Assistant Examiner—Michael Sherry
Attorney, Agent, or Firm—Rabin, Champagne, & Lynt, P.C.

[57] ABSTRACT

An electrostatic discharge protection network which diverts ESD stress arising between any two contact pads of an IC device, in order to prevent damage to the internal circuitry of the IC device. An ESD discharge bus is arranged around the periphery of an IC chip. Between each IC pad and the discharge bus, there is a protection circuit to directly bypass an ESD stress arising at any two IC pads. Each ESD protection circuit includes a diode, a thick-oxide device, a resistor, and a capacitor. The protection circuit is operated in snapback mode without causing breakdown. Therefore, the triggering voltage of the ESD protection circuit is lowered to the level of the snapback voltage but not to the level of the breakdown voltage.

6 Claims, 3 Drawing Sheets

ELECTROSTATC DISCHARGE PROTECTION NETWORK

BACKGROUND OF THE INVENTION

1. Field of the Invention

The invention generally relates to a circuit for protecting an associated integrated circuit (IC). More particularly, the invention relates to an electrostatic discharge network which can divert the electrostatic discharge (ESD) stress that arises between any two IC pads, in order to prevent damage to a circuit internal to the IC that would be caused by the electrostatic discharge.

2. Description of the Related Art

Electrostatic discharge is a phenomenon that commonly occurs during the handling of semiconductor integrated circuit devices. An electrostatic charge may accumulate for various reasons and produce potentially destructive effects on an IC device. Damage typically can occur during a testing phase of the IC fabrication or during assembly of the IC onto a circuit board, as well as during use of equipment into which the IC has been installed. Damage to a single IC due to poor ESD protection in an electronic device can partially, or sometimes completely, hamper its functionality. ESD protection for semiconductor ICs is, therefore, a reliability issue.

ESD stress models have been developed which are based on the reproduction of typical discharge pulses to which the IC may be exposed during manufacture or handling. Three standard models, known as the Human Body Model (HBM), Machine Model (MM), and Charged Device Model (CDM) have been developed. The human-body model is set forth in U.S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded while being handled.

The conventional design for preventing ESD damage is a prodigious network that, for the most part, involves locating a protection circuit between the input/output pads and the VSS terminal, between the input/output pads and the VDD terminal, and between the VSS and VDD power rails. Accordingly, such a prodigious network consumes a great amount of layout area, especially when used in a configuration including multi-power buses. Moreover, no ESD protection is provided between any two IC pads using the conventional design. Thus, ESD stress arising between two IC pads is only indirectly bypassed via the protection circuit located between the VSS and VDD power rails.

However, the ESD pulse will boost the electric potential at the power rails, resulting in potential damage to the internal circuitry. K. Narita et al. have proposed an ESD protection circuit design in their article entitled "A NOVEL ON-CHIP ELECTROSTATIC DISCHARGE (ESD) PROTECTION FOR BEYOND 500 MHz DRAM," IEDM Proceeding, 1995, pp. 539–542. However, this design features a common discharge line (CDL) as a discharge path, and further, the triggering voltage of their design (about 12V) is too high to protect submicron IC devices.

SUMMARY OF THE INVENTION

Therefore, it is an object of the invention to provide an ESD protection network having a triggering voltage lower than that of the conventional design, which can effectively make submicron IC devices immune to ESD damage.

Accordingly, an electrostatic discharge protection network is provided to protect an internal circuit from ESD damage. The network is connected to the internal circuit at the IC contact pads which connect the internal circuit to the IC input and output leads. This network includes a conducting line and a number of protection circuits electrically connected between corresponding contact pads and the conducting line. Each protection circuit includes a thick-oxide device, a resistor, a capacitor, and a diode. The thick oxide device includes a drain terminal and a source terminal, connected to the corresponding pad and the conducting line, respectively, and a gate terminal tied to the drain terminal. The resistor is connected between the bulk terminal of the thick-oxide device and the conducting line. The capacitor is connected between the corresponding pad and the bulk terminal of the thick-oxide device. The diode includes an anode connected to the conducting line and a cathode connected to the corresponding pad.

BRIEF DESCRIPTION OF THE DRAWINGS

Other objects, features, and advantages of the invention will become apparent by way of the following detailed description of the preferred but non-limiting embodiments. The description is made with reference to the accompanying drawings, wherein.

DESCRIPTION OF THE PREFERRED EMBODIMENTS

Figure 1:
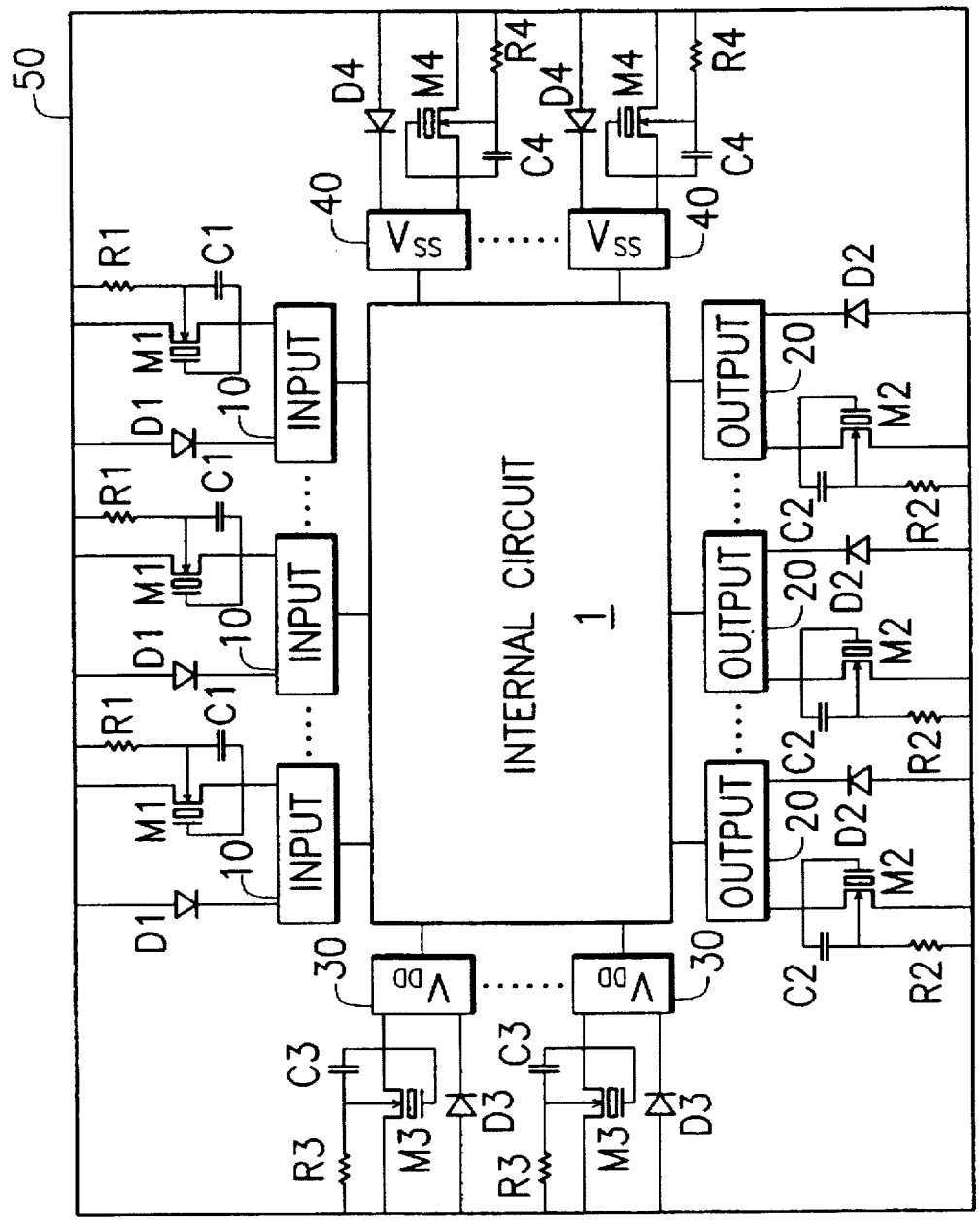
FIG. 1 schematically depicts a circuit diagram of an embodiment in accordance with the invention.

Referring to FIG. 1, the circuit diagram of an embodiment in accordance with the invention is schematically depicted. FIG. 1 shows an internal circuit 1 within an IC chip. The IC chip also includes input pads 10 and output pads 20. These pads may also function as input/output pads, depending on the design of the internal circuit. Furthermore, the IC chip includes VDD pads 30 to which the IC power source, normally 5V or 3V, is applied, and VSS pads 40, normally connected to a circuit ground while the IC chip is powered on. All of the pads 10, 20, 30, and 40 are electrically connected to the internal circuit 1 and provide a point of connection between the IC internal circuit and the IC package leads.

According to the invention, a bus 50, preferably made of metal, and disposed around the periphery of the IC chip, is provided as a discharge path to bypass ESD stress arising between any two IC pads. Each of pads 10, 20, 30, and 40 is coupled to the bus 50 by an individual ESD protection circuit, thereby forming an ESD protection network.

The ESD protection circuit arranged between each input pad 10 and the bus 50 includes a diode D1, a thick-oxide device M1, a resistor R1, and a capacitor C1. The diode D1 is connected at its anode to the bus 50 and at its cathode to the input pad 10. The thick-oxide device M1 is configured with its drain connected to the input pad 10 and with its source connected to the bus 50. The gate of the thick-oxide device M1 is also tied to the input pad 10. The bulk of the thick-oxide device M1 is coupled by the resistor R1 to the bus 50. The capacitor C1 is connected between the input pad 10 and the bulk of the device M1.

The ESD protection circuit arranged between each output pad 20 and the bus 50 includes a diode D2, a thick-oxide device M2, a resistor R2, and a capacitor C2. The diode D2 is connected at its anode to the bus 50 and at its cathode to the output pad 20. The thick-oxide device M2 is configured with its drain connected to the output pad 20 and with its source connected to the bus 50. The gate of the thick-oxide device M2 is also tied to the output pad 20. The bulk of the thick-oxide device M2 is coupled by the resistor R2 to the bus 50. The capacitor C2 is connected between the output pad 20 and the bulk of the device M2.

The ESD protection circuit arranged between each VDD power pad 30 and the bus 50 includes a diode D3, a thick-oxide device M3, a resistor R3, and a capacitor C3. The diode D3 is connected at its anode to the bus 50 and at its cathode to the VDD power pad 30. The thick-oxide device M3 is configured with its drain connected to the VDD power pad 30 and with its source connected to the bus 50. The gate of the thick-oxide device M3 is also tied to the VDD power pad 30. The bulk of the thick-oxide device M3 is coupled by the resistor R3 to the bus 50. The capacitor C3 is connected between the VDD power pad 30 and the bulk of the device M3.

The ESD protection circuit arranged between each VSS power pad 40 and the bus 50 includes a diode D4, a thick-oxide device M4, a resistor R4, and a capacitor C4. The diode D4 is connected at its anode to the bus 50 and at its cathode to the VSS power pad 40. The thick-oxide device M4 is configured with its drain connected to the VSS power pad 40 and with its source connected to the bus 50. The gate of the thick-oxide device M4 is also tied to the VSS power pad 40. The bulk of the thick-oxide device M4 is coupled by the resistor R4 to the bus 50. The capacitor C4 is connected between the VSS power pad 40 and the bulk of the device M4.

When an ESD that has a positive polarity with respect to the bus 50 stresses any pad 10, 20, 30, or 40, the corresponding thick-oxide device M1, M2, M3, or M4 is turned on to bypass the ESD pulse to the bus 50, and damage to the protected internal circuit is avoided. Conversely, when an ESD that has a negative polarity with respect to the bus 50 stresses any pad 10, 20, 30, or 40, the associated diode D1, D2, D3, or D4 is forward biased to conduct the discharge current therethrough so as to bypass the ESD stress to the bus 50. Once again, the network prevents ESD from damaging the internal circuit.

Figure 2:
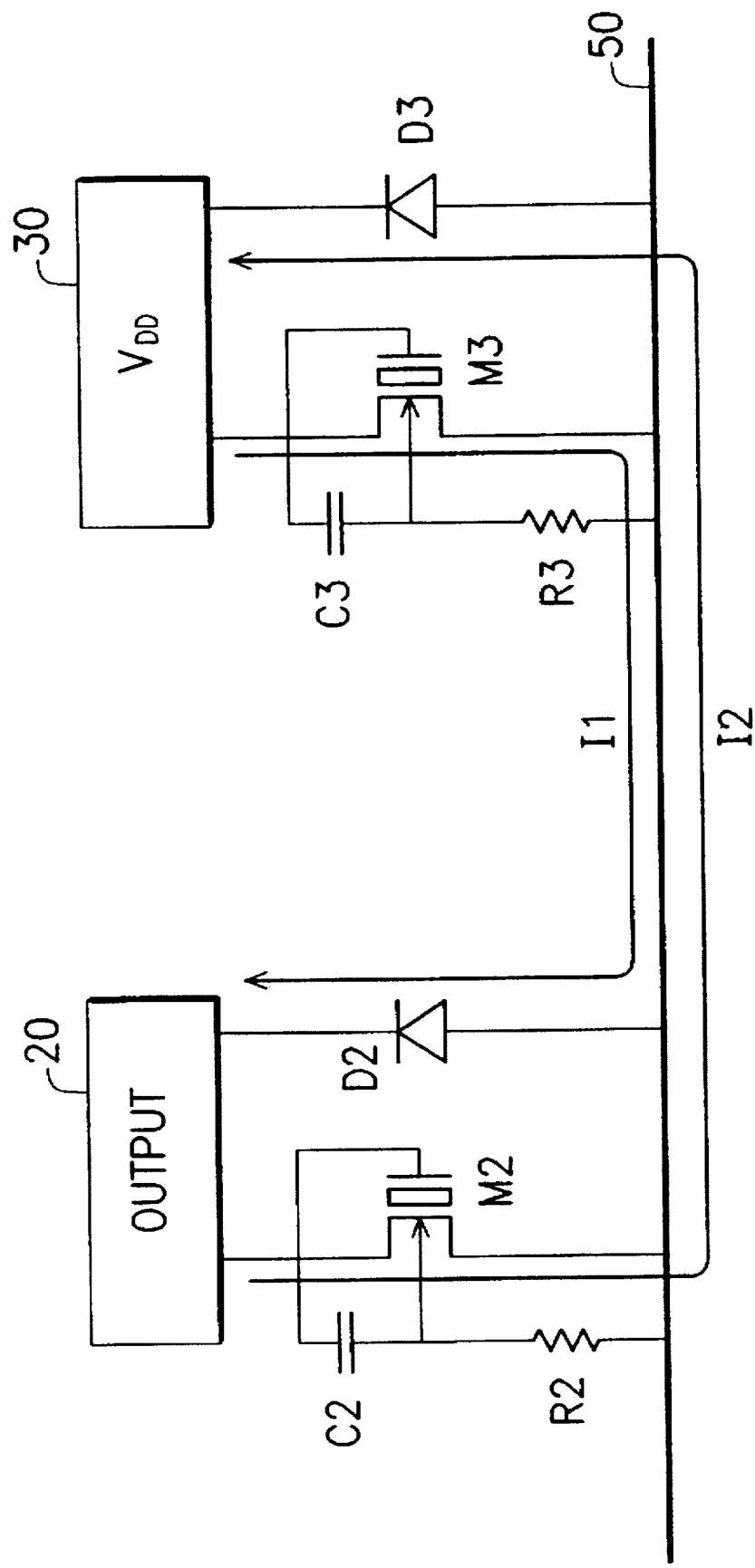
FIG. 2 schematically depicts the protection circuit between any two IC pads.

Referring to FIG. 2, the protection circuit between any two pads is schematically depicted, wherein the circuit between a VDD power pad 30 and an output pad 20 is shown by way of example. When an ESD stress having a positive polarity with respect to the output pad 20 arises at the VDD power pad 30, the associated ESD voltage is coupled by the capacitor C3 to the bulk of the thick-oxide device M3, which forward biases the bulk/source junction of the device M3 and thus triggers the thick-oxide device M3 to be operated in snapback mode. Consequently, a great amount of ESD discharge current I1 flows from the VDD power pad 30, through the bus 50, to the output pad 20, because the diode D2 is forward biased.

Conversely, when an ESD stress having a negative polarity with respect to the output pad 20 arises at the VDD power pad 30, the associated ESD voltage is coupled by the capacitor C2 to the bulk of the thick-oxide device M2, which forward biases the bulk/source junction of the device M2 and thus triggers the thick-oxide device M2 to be operated in snapback mode. Consequently, a great amount of ESD discharge current I2 flows from the output pad 20, through the bus 50 and then to the VDD power pad 30, because the diode D3 is forward biased. Similarly, any two pads are provided with a direct discharge path during an ESD event, without boosting the potential at the power rails, which would damage the internal circuit 1.

Figure 3:
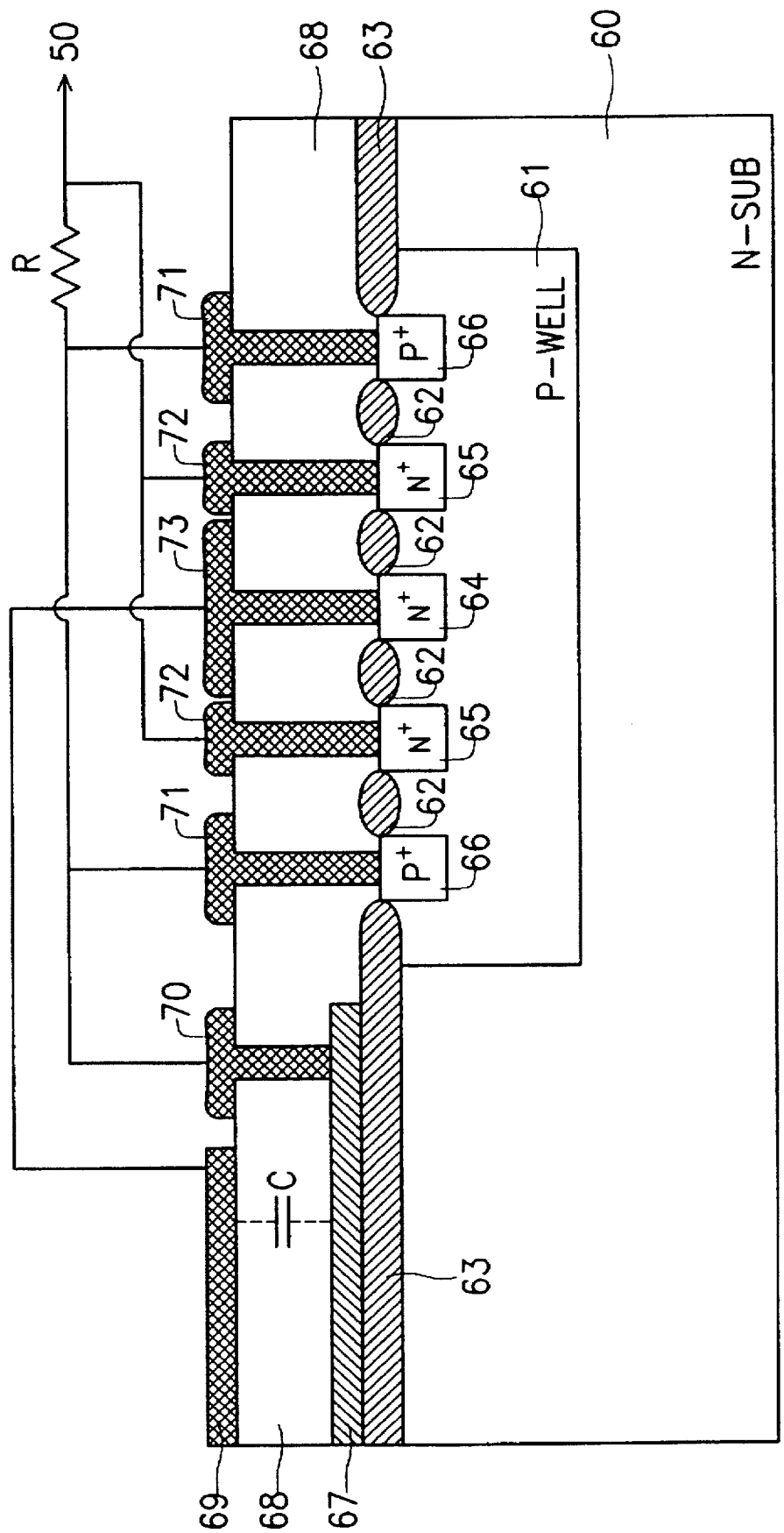
FIG. 3 schematically depicts in a cross-sectional view the thick-oxide device shown in FIG. 1, fabricated on a semiconductor substrate.

Referring to FIG. 3, a thick-oxide device, such as device M1, M2, M3, or M4 depicted in FIG. 1, as fabricated on a semiconductor substrate, is illustrated in a cross-sectional view. As shown in the drawing, a P-well region 61 is formed in an N-type substrate 60. Field oxide portions 62 and 63 are thermally grown, preferably by a LOCOS (local oxidation of silicon) process, overlying a predetermined area of the substrate, as isolating structures. A first heavily-doped N-type region 64 is formed in the P-well region 61 to function as the drain terminal of the thick-oxide device. At least one second heavily-doped N-type region 65 (two second heavily-doped regions are shown by way of example in FIG. 3) is formed in the P-well region 61 as the source terminal of the thick-oxide device and is spaced apart from the first heavily-doped region 64 by one of the field oxide portions 62. At least one contact region 66 (two contact regions are shown by way of example in FIG. 3), forming the bulk terminal of the thick-oxide device, is formed in the P-well region 61 by implanting P-type impurities therein. Each contact region 66 is spaced apart from the adjacent second heavily-doped region 65 by one of the field oxide portions 62.

A polysilicon layer 67, doped with impurities, is formed on one of the field oxide portions 63, preferably at one side of the substrate 60. A dielectric layer 68 is deposited to cover the overall surface of the substrate and then is etched to shape several contact windows in order to expose the polysilicon layer 67, contact regions 66, first N-type heavily-doped region 64 and second N-type heavily-doped regions 65. A metal pad 69, which can function as the input pad 10, the output pad 20, or one of the power pads VDD or VSS as shown in FIG. 1, depending on the configuration in which the circuit of the invention is used, is formed on the dielectric layer 68 above the polysilicon layer 67. Accordingly, the pad 69, the dielectric layer 68, and the polysilicon layer 67 form a capacitor C, which functions as the capacitor C1, C2, C3, or C4 in the network shown in FIG. 1. This capacitor C is formed by the pad 69, the dielectric layer 68, and the polysilicon layer 67 therebelow without consuming extra layout area. A plurality of metal contacts 70, 71, 72, 73 are formed on the dielectric layer 68 and are connected to the polysilicon layer 67, contact regions 66, second heavily-doped regions 65, and first heavily-doped region 64 through the associated contact windows, respectively. Note that the metal contact 73 preferably covers an area over the field oxide portions 62 on the opposing sides of the first N-type heavily-doped region 64 and functions as the gate terminal of the thick-oxide device.

According to the ESD protection circuits depicted in FIG. 1, the pad 69 is electrically coupled to the first heavily-doped N-type region 64 via the metal contact 73. The polysilicon layer 67 is electrically coupled by the metal contacts 70 and 71 to the contact regions 66, and is also coupled to the bus 50 by the resistor R. Although designated by a component symbol, the resistor R may be a thin-film resistor, a well resistor, or any other electrical resistance component, functioning as the resistor R1, R2, R3, or R4. Moreover, the second heavily-doped N-type regions 65 are electrically coupled by the metal contacts 72 to the bus 50.

As shown in FIG. 3, the thick-oxide device is operated in a bipolar mode, in which the first heavily-doped N-type region 64, the P-well region 61, and the second heavily-doped N-type regions 65 constitute the collector, base, and emitter of an NPN bipolar junction transistor, respectively, during an ESD event. When an ESD event occurs at the pad 69, an ESD pulse having a positive pulse with respect to the bus 50 is coupled to the P-well region 61 by the capacitor C to forward bias the junction between the P-well region 61 and the second heavily-doped N-type region 65. Consequently, the NPN bipolar transistor is operated in snapback mode without causing breakdown. Therefore, the ESD stress occurring at the pad 69 is bypassed because the ESD current flows from the first heavily-doped N-type region 64 to the second heavily-doped N-type regions 65 and is then discharged to the bus 50.

The ESD discharge current disperses through two opposite sides of the first N-type heavily-doped region 64 shown in FIG. 3, in effect minimizing local heating of the ESD protection circuit. Moreover, the triggering voltage of the ESD protection circuit is lowered to the level of the snapback voltage but not to the level of the breakdown voltage. This turn-on voltage clamps the pad 69 to a low voltage level so that the internal circuit 1 is protected from ESD damage.

Because the P-well region 61 is coupled by the resistor R to the bus 50, the resistor R and the capacitor C provide a time delay to sustain the forward bias between the P-well region 61 and the second heavily-doped N-type regions 65 during the ESD event. For example, according to the HBM model, the rise time of the ESD pulse is about 10 ns. Therefore, by the proper selection of resistance and capacitance values, the RC time constant can be adjusted to the range of about 10 ns, to sustain the forward bias during the ESD event. Accordingly, the capacitance of the capacitor C may be selected from the range of about 0.5–2 pF, and the resistance of the resistor R may be set within the range of about 5K $\Omega$ to about 20K $\Omega$, in order to provide the appropriate time constant.

The diodes D1, D3, and D4 as depicted in FIG. 1, may be formed by another N+/P-well junction. The diode D2, disposed at the output pad 20 (or input/output pads) as depicted in FIG. 1, can be formed by the junction between the drain and the bulk of the NMOS transistor of an output buffer. Thus, a diode is provided for the circuit without consuming additional layout area.

In summary, the invention makes use of an ESD discharge bus arranged around the periphery of an IC chip. A protection circuit is provided between each IC pad and the discharge line, to directly bypass an ESD stress arising at any two IC pads. Each ESD protection circuit comprises a diode, a thick-oxide device, a resistor, and a capacitor. The protection circuit is operated in snapback mode without reaching breakdown. Therefore, the triggering voltage of the ESD protection circuit is lowered to the level of the snapback voltage but not to the level of the breakdown voltage.

Alternative embodiments of the invention have now been described in detail. It is to be noted, however, that this description is illustrative of the principles underlying the inventive concept. It is therefore contemplated that various modifications of the disclosed embodiments will, without departing from the spirit and scope of the invention, be apparent to persons of ordinary skill in the art, and the scope of the invention is intended to be limited only by the appended claims.

What is claimed is:

1. An electrostatic discharge protection network for protecting a circuit internal to an IC from ESD damage, comprising:

a conducting line;

a plurality of IC contact pads for electrical coupling to the internal circuit;

a plurality of protection circuits, each of the protection circuits being electrically coupled between a corresponding one of the contact pads and the conducting line, each of the protection circuits comprising:

a thick-oxide device having a bulk terminal, a drain terminal coupled to the corresponding contact pad, a source terminal coupled to the conducting line, and a gate terminal coupled to the drain terminal;

a resistor coupled between the bulk terminal and the conducting line;

a capacitor coupled between the corresponding contact pad and the bulk terminal; and a diode having an anode coupled to the conducting line and a cathode coupled to the corresponding contact pad.

2. The protection network as claimed in claim 1, wherein at least one of the contact pads is an input pad.

3. The protection network as claimed in claim 1, wherein at least one of the contact pads is an output pad.

4. The protection network as claimed in claim 1, wherein at least one of the contact pads is an input/output pad.

5. The protection network as claimed in claim 1, wherein at least one of the contact pads is a power pad.

6. The protection network as claimed in claim 1, further comprising:

an N-type silicon substrate, wherein the thick oxide device is formed on the substrate;

a P-well formed in the substrate;

at least one contact region formed in the P-well;

an isolating structure formed on the substrate;

a polysilicon layer formed on the isolating structure, the polysilicon layer being coupled to the contact region and being coupled by the resistor to the conducting line;

a dielectric layer overlying the polysilicon layer;

a metal pad formed on the dielectric layer above the polysilicon layer, wherein the metal pad, the dielectric layer, and the polysilicon layer form the capacitor, and wherein the capacitor couples an ESD voltage to the P-well when an ESD stress arises at the metal pad;

a first heavily-doped N-type region formed in the P-well and coupled to the metal pad; and at least one second heavily-doped N-type region spaced apart from the first heavily-doped N-type region, and coupled to the conducting line, wherein the first heavily-doped N-type region, the second heavily-doped N-type region, and the P-well form a bipolar junction transistor which bypasses ESD stress when the ESD voltage is coupled to the P-well through the capacitor.

* * * * *